(12) United States Patent
Jensen

(10) Patent No.: US 7,405,630 B2
(45) Date of Patent: Jul. 29, 2008

(54) FREQUENCY SYNTHESIZER WITH IMPROVED SPURIOUS PERFORMANCE

(75) Inventor: Henrik T. Jensen, Long Beach, CA (US)

(73) Assignee: Broadcom Corporation, Irvine, CA (US)

( * ) Notice: Subject to any disclaimer, the term of this patent is extended or adjusted under 35 U.S.C. 154(b) by 356 days.

(21) Appl. No.: 11/242,432

(22) Filed: Sep. 30, 2005

(65) Prior Publication Data

US 2007/0075787 A1 Apr. 5, 2007

(51) Int. Cl.
*H03L 7/00* (2006.01)
(52) U.S. Cl. .............................. 331/17; 331/179; 331/34
(58) Field of Classification Search .................... 331/17, 331/34, 179
See application file for complete search history.

(56) References Cited

U.S. PATENT DOCUMENTS 7,145,400 B2 * 12/2006 Horan ......................... 331/17

* cited by examiner

*Primary Examiner*—Arnold Kinkead
(74) *Attorney, Agent, or Firm*—Garlick Harrison & Markison; Holly L. Rudnick

(57) ABSTRACT

A loop filter for use in a frequency synthesizer provides improved spurious performance using switched capacitors. The loop filter includes a first switched capacitor having a first capacitance value and which is operable to charge to a first voltage corresponding to a current pulse indicative of a difference in phase or frequency between a reference signal and a feedback signal. The loop filter further includes a second switched capacitor having a second capacitance value and which is operable to charge to a second voltage from the first voltage and produce a control voltage based upon the second voltage. The loop filter has a bandwidth determined by a ratio of the second capacitance value to the first capacitance value.

16 Claims, 10 Drawing Sheets

FREQUENCY SYNTHESIZER WITH IMPROVED SPURIOUS PERFORMANCE

BACKGROUND

1. Technical Field

The present invention relates to wireless radio systems and, more particularly, frequency synthesizers for use in radio front end circuitry to down-convert RF signals.

2. Related Art

The demand for high performance universal frequency synthesizers is growing with the increasing performance and integration requirements of wireless radio frequency (RF) systems, such as cellular telephony and FM radio systems. Phase locked loop (PLL) frequency synthesis is a popular indirect frequency synthesis method for high performance applications due to its agility and the ability of synthesizing frequencies over wide bandwidths with narrow channel spacing. However, PLL synthesizer design still remains a challenging aspect of RF system design, because of the stringent requirements typically imposed on frequency synthesizers. For example, frequency synthesizers are typically required to be defined with an output frequency accuracy on the order of a few parts per million (PPM). Furthermore, in most cases, the output frequency must also be capable of being varied in small precise steps, such as a few hundred kilo-hertz (kHz), corresponding to the RF channel spacing.

In addition to accuracy and channel spacing, other aspects of PLL frequency synthesizers influence the performance of a receiver, such as phase noise, reference spurs and lock time. In radio receivers, if the phase noise produced by the frequency synthesizer mixes with nearby interferers that are then converted onto the desired channel, the signal-to-noise ratio of the received signal can be adversely affected. In addition, reference spurs may cause the receiver to down-convert undesired interferers. Furthermore, the lock time required in typical RF systems varies from a few milliseconds (ms.) to a few tens of microseconds (us.). As used herein, the term "lock time" refers to an indication of how fast a new frequency is established when the RF receiver commands a change in the channel.

Frequency synthesizers typically include a precise crystal oscillator (X-TAL) providing a reference frequency, a phase and frequency detector (PFD), a charge pump (CP), a lowpass loop filter (LPF), a voltage controlled oscillator (VCO), and one or more divider blocks in the feedback path that each divide the incoming signal by some integer of either fixed or on-the-fly programmable value to produce a feedback signal. Ideally, the charge transferred into the LPF from the CP is proportional to the phase difference between reference and feedback signals. In practice, however, the characteristics of the PFD/CP combination do not provide a completely linear transfer curve. Loop filter leakage currents in combination with non-uniform phase error sampling gives rise to considerable "reference spurs" (i.e., periodic modulations of the VCO generating tones around the RF carrier) and elevated in-band noise. Thus, the VCO output, i.e., the RF carrier, contains sidebands corresponding to such "feed-through" of the reference frequency.

In many applications, reference feed-through may have a detrimental effect on receiver performance if not appropriately limited. For example, reference feed-through may mix with a high-powered out-of-band interferer and thereby degrade the in-band signal-to-noise (SNR) ratio. Even worse, if the reference spur is generated directly within the signal band, the down-converted radio signal contains copies of the desired signal at frequency offsets corresponding to the reference frequency.

Therefore, a need exists for a frequency synthesizer design for use in radio receivers that minimizes reference feed-through.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

A better understanding of the present invention can be obtained when the following detailed description of the preferred embodiment is considered with the following drawings, in which.

DETAILED DESCRIPTION OF THE DRAWINGS

Figure 1:
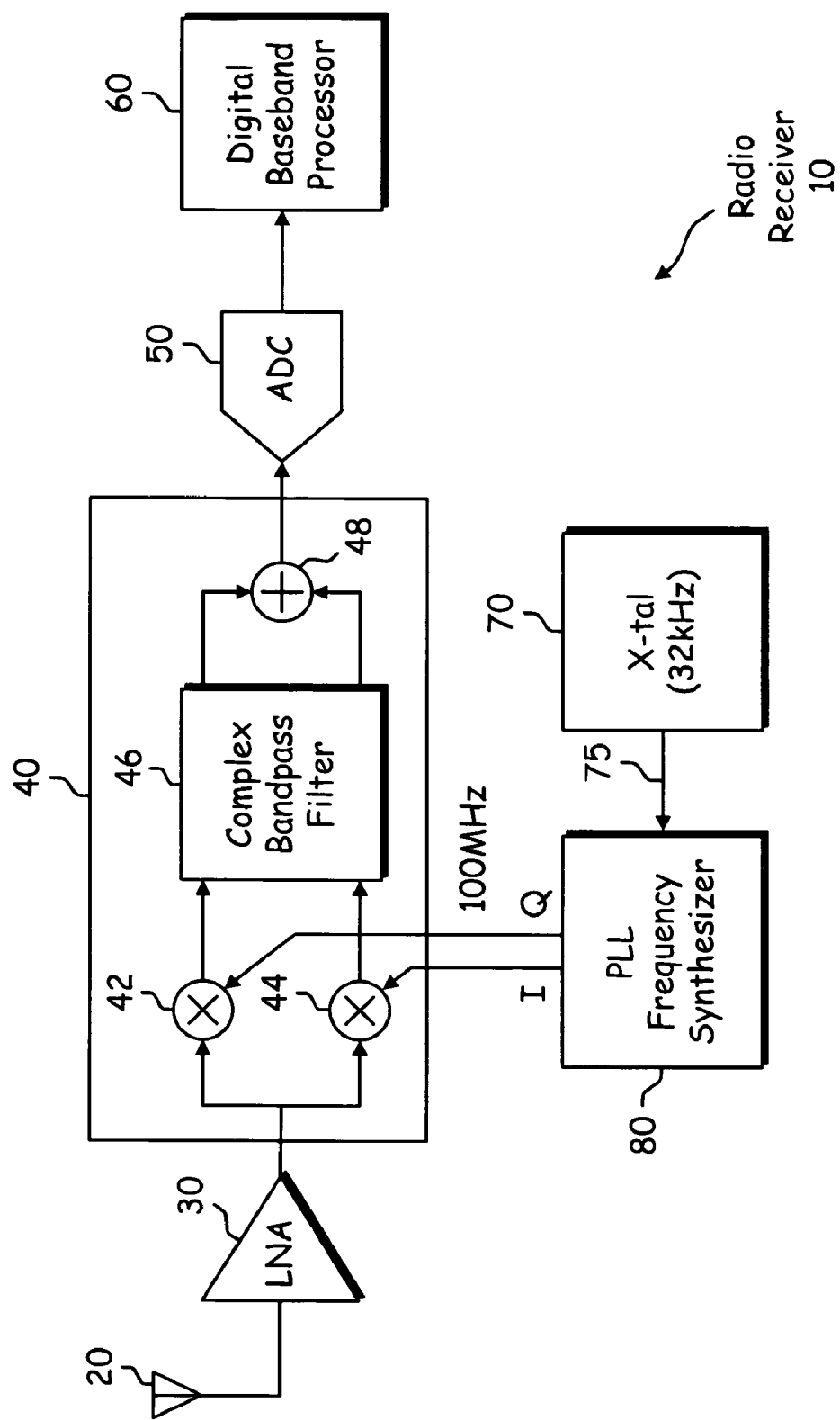
FIG. 1 is a schematic block of a radio receiver in accordance with the present invention.

FIG. 1 is a schematic block diagram of a radio receiver 10 that includes a low noise amplifier 30, a down conversion module 40, an analog to digital converter 50, and a digital demodulator 60. The down conversion module 40 includes mixers 42 and 44, an analog bandpass filter (BPF) 46 and a summation node 48.

In operation, the receiver receives inbound RF signals via antenna 20, and the low noise amplifier 40 amplifies the inbound RF signals to produce amplified inbound RF signals. The amount of amplification of the low noise amplifier depends on the received signal strength of the inbound RF signals and the dynamic range of the analog to digital converter 50. The mixers 42 and 44 of the down conversion module 40 mix the amplified inbound RF signals with in-phase (I) and quadrature (Q) components of a receiver local oscillation signal, respectively, to produce in-phase mixed signals and quadrature mixed signals. The receiver local oscillation signal is produced by a phase-locked-loop (PLL) frequency synthesizer 80. The PLL frequency synthesizer 80 is coupled to receive a precise reference frequency 75 from a crystal oscillator 70 to produce the local oscillation signal.

The combination of the analog bandpass filter 46 and summation node 48 substantially passes the frequency difference component of the in-phase and quadrature mixed signals unattenuated and attenuates the frequency sum component of the in-phase and quadrature mixed signals to produce low intermediate frequency (IF) or baseband signals. The analog to digital converter 50 converts the low IF or baseband signals from the analog domain to the digital domain to produce digital low IF or baseband signals. The digital demodulator 60 converts the digital low IF signals into inbound symbols, which may be binary data, PSK data, and/or FSK data.

Figure 2:
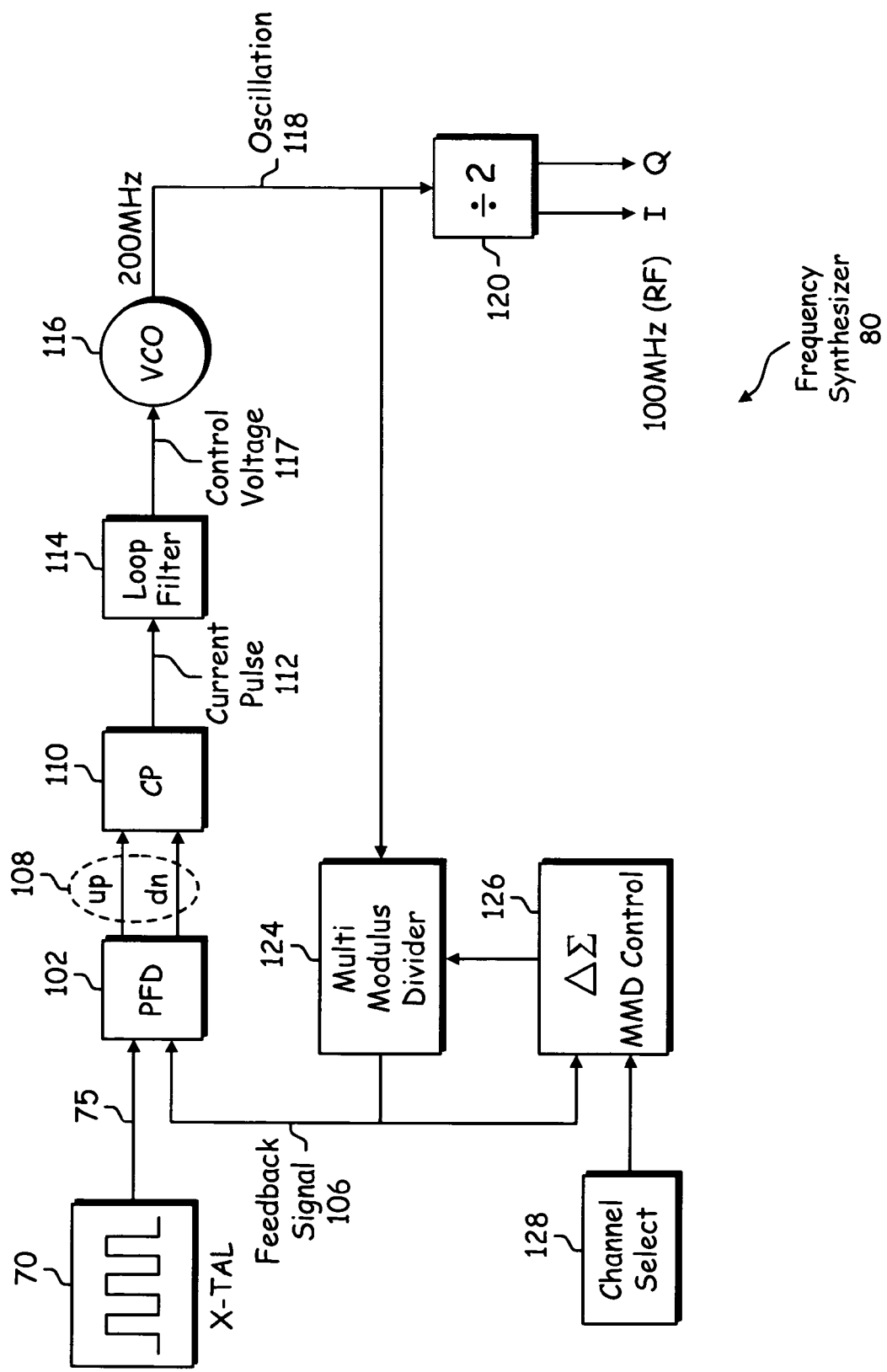
FIG. 2 is a schematic block diagram of a frequency synthesizer for use in a radio receiver in accordance with the present invention.

FIG. 2 is a functional block diagram of a PLL frequency synthesizer 80 according to one embodiment of the present invention. The PLL frequency synthesizer 80 includes a phase frequency detector (PFD) 102 that is coupled to receive a precise reference signal 75 from a crystal oscillator 70 for comparing with a feedback signal 106 to produce an error signal 108 indicative of a phase or frequency difference between the reference signal 75 and the feedback signal 106. A charge pump (CP) 110 produces current pulses 112 based upon the error signal 108, and provides the current pulses to a low pass loop filter (LF) 114.

LF 114 produces a control voltage 117 from the current pulses, and provides the control voltage to a voltage controlled oscillator (VCO) 116. VCO 116 produces an oscillation 118 based on the control voltage 117, and inputs the oscillation 118 to a divider 120 in a first divider stage of a divider chain to produce I and Q components of a local oscillation signal to be mixed with an RF signal in a radio receiver. In the described embodiment, the divider 120 is a fixed integer divider. In addition, a programmable divider, such as a multi-modulus divider (MMD) 124, is used in a last divider stage of the divider chain before the feedback signal 106 is produced therefrom and is provided to the PFD 102. MMD 124 sets the integer divider ratio based upon a divider control signal received from a ΔΣ MMD controller 126. ΔΣ MMD controller 126 generates control signals to MMD 124 based upon a channel select value received from channel select logic 128. In a properly designed PLL, the feedback loop properties of the PLL results in the VCO output "locking" to a frequency equal to the product of crystal oscillator reference frequency and the "average" divide ratio of the divider chain.

The VCO 116 is typically calibrated for every channel hop. This calibration process involves a sequence of switching in and out of capacitors that tune the operation frequency of the VCO. Typically, calibration of a PLL occurs in two stages. Initially, an open loop stage serves to place the output oscillation 118 with an approximate deviation of a desired frequency of oscillation. Thus, the open loop stage is followed by a closed loop phase that locks the oscillation to a desired frequency of oscillation. After open loop calibration is completed, the VCO oscillation frequency may, however, be off by many MHz relative to the target frequency. A typical scenario is that the VCO is off by 10 MHz relative to the desired frequency. Thus, after calibration, the closed loop calibration stage of the PLL is operable to drive the VCO to the desired operating frequency by driving the control voltage 117 to an appropriate value. This process of driving the control voltage 117 to the appropriate value is referred to as the frequency synthesizer settling.

Figure 3:
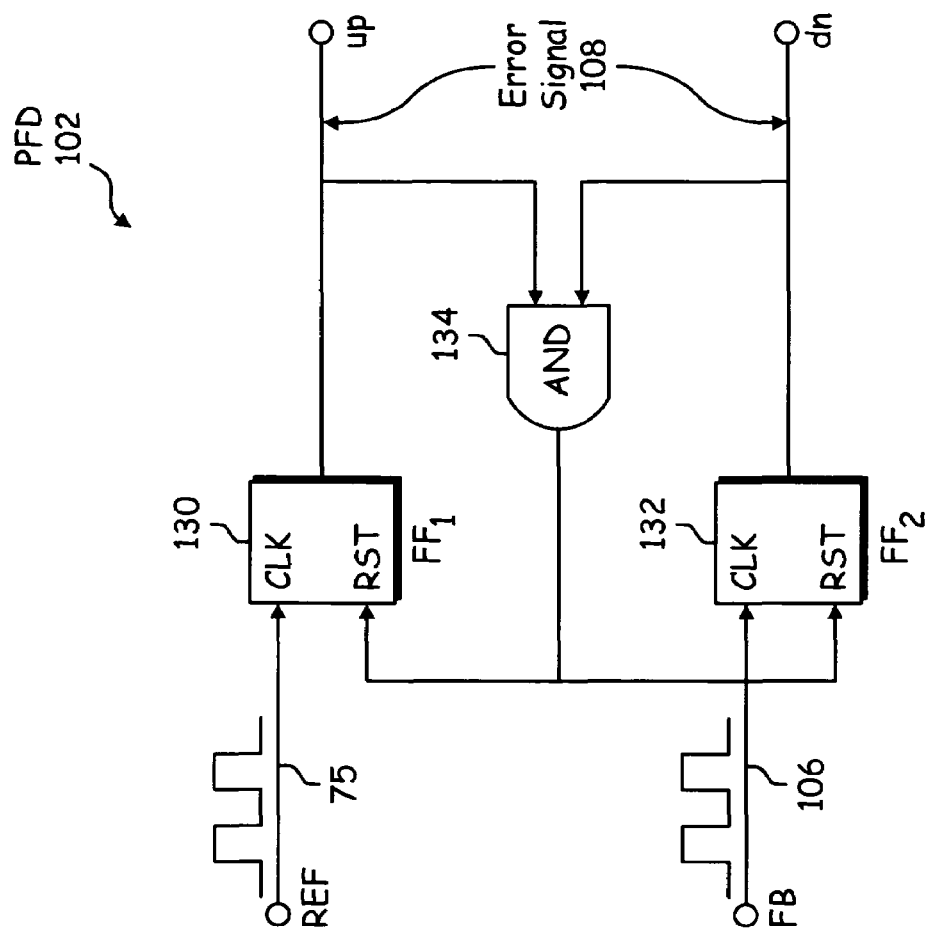
FIG. 3 is a functional block diagram of a phase-frequency detector of the frequency synthesizer of the present invention.

FIG. 3 is a functional block diagram of a phase frequency detector (PFD) 102 formed according to one embodiment of the present invention. Two reset-able flip-flops 130 and 132 are coupled with an AND gate 134 in a feedback loop to produce an error signal 108. Assuming that the reference signal (REF) 75 and the feedback signal (FB) 106 are appropriate for driving digital circuitry, the operation of the PFD is as follows. After reset, the outputs UP and DN are LOW, or 0. Whenever REF goes HIGH, or 1, then UP goes HIGH. When FB goes HIGH, DN goes HIGH momentarily, resulting in a positive edge at the AND gate output. This edge resets the two flip-flops to the initial state (UP,DN)=(0,0). Thus, any phase difference between the two signals REF and FB results in the PFD residing in the state (UP,DN)=(1,0) for a duration of time proportional to the phase difference between REF and FB. Similarly, any difference in frequency between REF and FB results in the PFD residing in either the state (UP,DN)=(1,0) or the state (UP,DN)=(0,1), depending upon the sign of the frequency difference.

Figure 4:
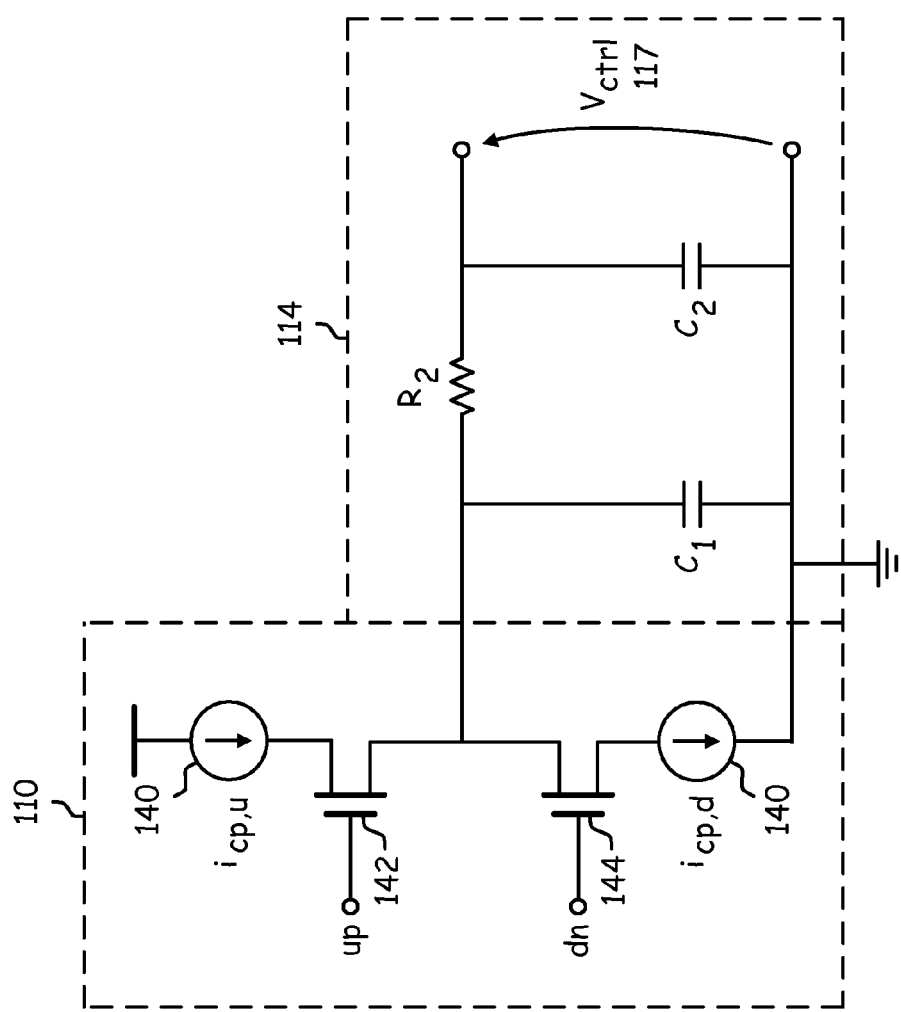
FIG. 4 is a functional block diagram of a conventional charge pump and loop filter combination.

FIG. 4 is a functional block diagram of a conventional charge pump 110 and loop filter 114 combination. The charge pump 110 responds to the (UP,DN) control signals of error signal 108 of the PFD by either "pumping" current into the loop filter 114 or moving current out of the loop filter 114 and "pumping" it into ground. The charge pump (CP) 110 includes two equally weighted (matching) current sources 140, each with a nominal output current ICP, in an arrangement with two switches implemented as MOSFETs 142 and 144 that are operatively biased by input signals UP and DN of error signal 108. As configured, MOSFET 142 is a PMOS, while MOSFET 144 is an NMOS. Thus, CP 110 essentially functions as an asynchronously clocked digital-to-analog converter (DAC) whose nominal output y CP(t) depends upon the digital inputs UP and DN such that $$y_{CP}(t) = \begin{cases} I_{CP}, & \text{if } \{UP, DN\} = \{1, 0\} \\ 0, & \text{if } \{UP, DN\} = \{1, 1\} \\ 0, & \text{if } \{UP, DN\} = \{0, 0\} \\ -I_{CP}, & \text{if } \{UP, DN\} = \{0, 1\} \end{cases}$$

The current pulses of CP 110 are filtered by the loop filter 114, thereby generating a smooth output voltage referred to as the "control voltage", $V_{ctrl}$ 117. The loop filter 114 shown in FIG. 4 consists of passive components, e.g., resistor R2 and capacitors C1 and C2. As mentioned above, the strict phase noise requirements of PLL frequency synthesizers dictate a narrow loop filter bandwidth. To achieve such narrow bandwidth, the capacitors C1 and C2 are typically implemented as CMOS transistors. However, with its susceptibility to substrate noise coupling, leakage current is particularly troublesome in CMOS implementations.

Figure 5:
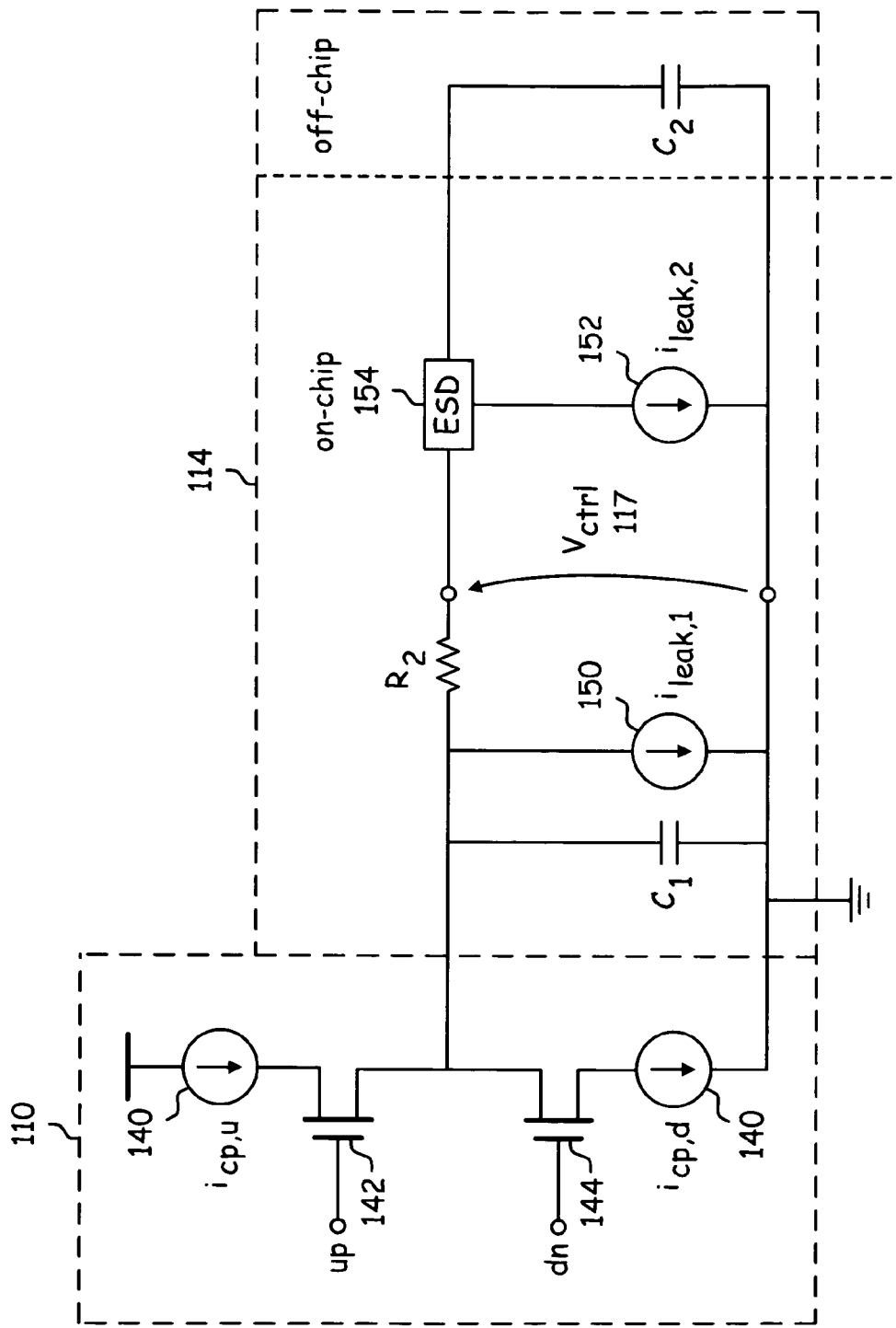
FIG. 5 illustrates exemplary leakage current contributing to reference feed-through in the conventional charge pump and loop filter combination shown in FIG. 4.

For example, referring now to FIG. 5, exemplary leakage current sources in an exemplary CMOS loop filter are illustrated. A first leakage current source 150, denoted $i_{leaks,1}$, results from substrate coupling in the on-chip metal oxide semiconductor capacitor (MOSCAP) C1. A second leakage current source 152, denoted $i_{leak,\,2}$, results from coupling between electrostatic discharge (ESD) protection pad 154 required to protect MOSCAP C1 and off-chip MOSCAP C2. The two leakage current sources 150 and 152 effectively discharge capacitors C1 and C2, causing a steady state ripple in the control voltage $V_{ctrl}$ 117. The resulting loop filter leakage currents, in combination with non-uniform phase error sampling, gives rise to considerable "reference spurs" (i.e., periodic modulations of the VCO generating tones around the RF carrier) and elevated in-band noise.

Figure 6:
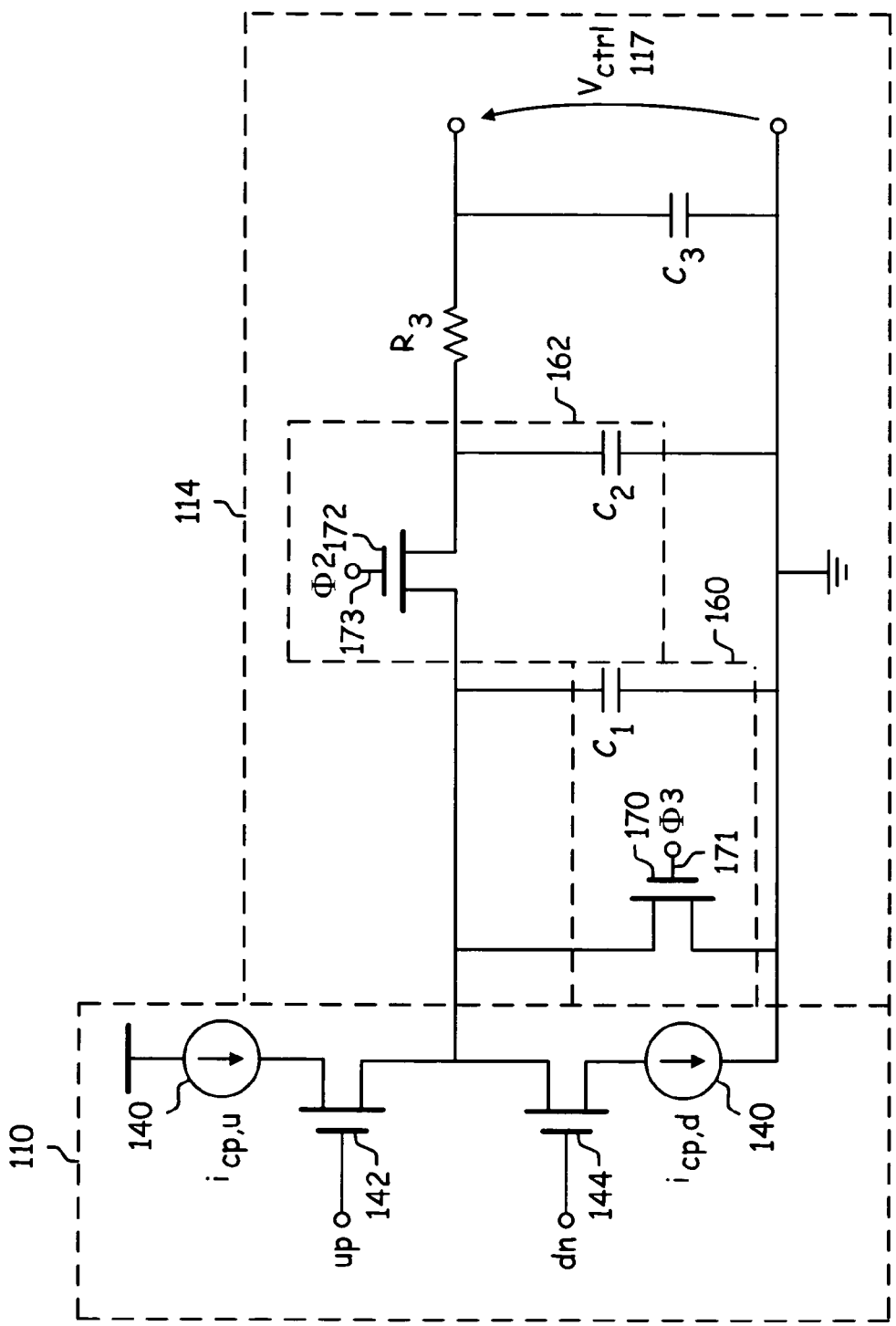
FIG. 6 is a functional block diagram of a loop filter according to one embodiment of the invention.

FIG. 6 is a functional block diagram of a charge pump 110 and loop filter 114 configuration that satisfies phase noise requirements and minimizes both reference feed-through and elevated in-band noise according to one embodiment of the invention. Generally, the charge pump 110 and loop filter 114 of FIG. 6 provide adequate narrowband filtering while eliminating the primary sources of leakage current.

The connectivity of charge pump 110 and loop filter 114 combination of the frequency synthesizer of the present invention are shown in FIG. 6. The charge pump 110 in FIG. 6 is similar to the charge pump of FIG. 4 in that charge pump 110 is coupled to receive error signal produced by the PFD. The error signal includes the UP and DOWN signals to operatively bias MOSFETs 142 and 144 according to whether current is to be sourced into the loop filter 114 or removed from the loop filter 114. Thus, charge pump 110 produces current pulses based upon the error signal.

In accordance with embodiments of the present invention, the loop filter 114 is implemented using an on-chip narrowband loop filter with a switched-capacitor configuration. The switched-capacitor configuration uses only metal capacitors, thereby eliminating the MOSCAP leakage current ($i_{leak,1}$ and $i_{leak,2}$) shown in FIG. 5. For example, as shown in FIG. 6, the loop filter 114 is implemented with switched capacitors 160 and 162. Switched capacitor 160 is formed of switch 170 and metal capacitor C1, while switched capacitor 162 is formed of switch 172 and metal capacitor C2. Capacitor C1 has a first capacitance value and is coupled to receive the current pulses from CP 110, while capacitor C2 has a second capacitance value and is coupled in parallel to C1. Switch 170 is operable to reset capacitor C1 based upon a state of a first clock signal ($\Phi_3$) 171. Switch 172 is operable to select capacitor C2 based upon a state of a second clock signal ($\Phi_2$) 173.

The mode of operation of the combination of the charge pump 110 and loop filter 114 of the present invention is as follows. As described above, charge pump 110 produces a current pulse based upon the error signal. While charge pump 110 is producing the current pulse, the first clock signal ($\Phi_3$) 171 places switch 170 in an "OFF" or open state and the second clock signal ($\Phi_2$) 173 places switch 172 in an "OFF" or open state to enable the capacitor C1 to charge to a voltage corresponding to the current pulse. After capacitor C1 has completely charged, clock signal 173 places switch 172 in an "ON" or closed state to connect capacitors C1 and C2 and enable charge sharing between capacitors C1 and C2. Thus, a portion of the charge on capacitor C1 is transferred from capacitor C1 to capacitor C2 while switch 172 is closed and switch 170 is open. Once charge sharing is complete, the second clock signal 173 places switch 172 in an open state to disconnect capacitors C1 and C2, and the first clock signal 171 places switch 170 in a closed state to discharge capacitor C1.

The charge sharing between capacitors C1 and C2 continues with each new current pulse until the voltage on capacitor C2 is equivalent to the voltage on capacitor C1, thereby reaching a steady state voltage. A passive filter formed of R3 and C3 lowpass filters the voltage on C2 and outputs the lowpass filtered voltage as the control voltage $V_{ctrl}$ 117.

The loop filter structure shown in FIG. 6 has a bandwidth given by the following equation:

$$f_{-3\,dB} = \frac{1}{2\pi\left(\frac{C_2}{C_1} + \frac{1}{2}\right)} f_{REF}.$$

Thus, the bandwidth of the loop filter 114 shown in FIG. 6 is determined by a ratio of the capacitance value of C2 to the capacitance value of C1. As a result, a narrow LPF can be implemented with a small amount of capacitance on each capacitor C1 and C2, which enables the use of non-leaky metal capacitances as capacitors C1 and C2. For example, assuming C1 has a capacitance value of 25 pF, C2 has a capacitance value of 50 pF and the reference frequency $f_{REF}$ is 32.768 kHz, the loop filter bandwidth is given by:

$$f_{-3\,dB} = \frac{1}{2\pi} \frac{32.768}{2.5} \approx 2 \text{ kHz}.$$

Figure 7:
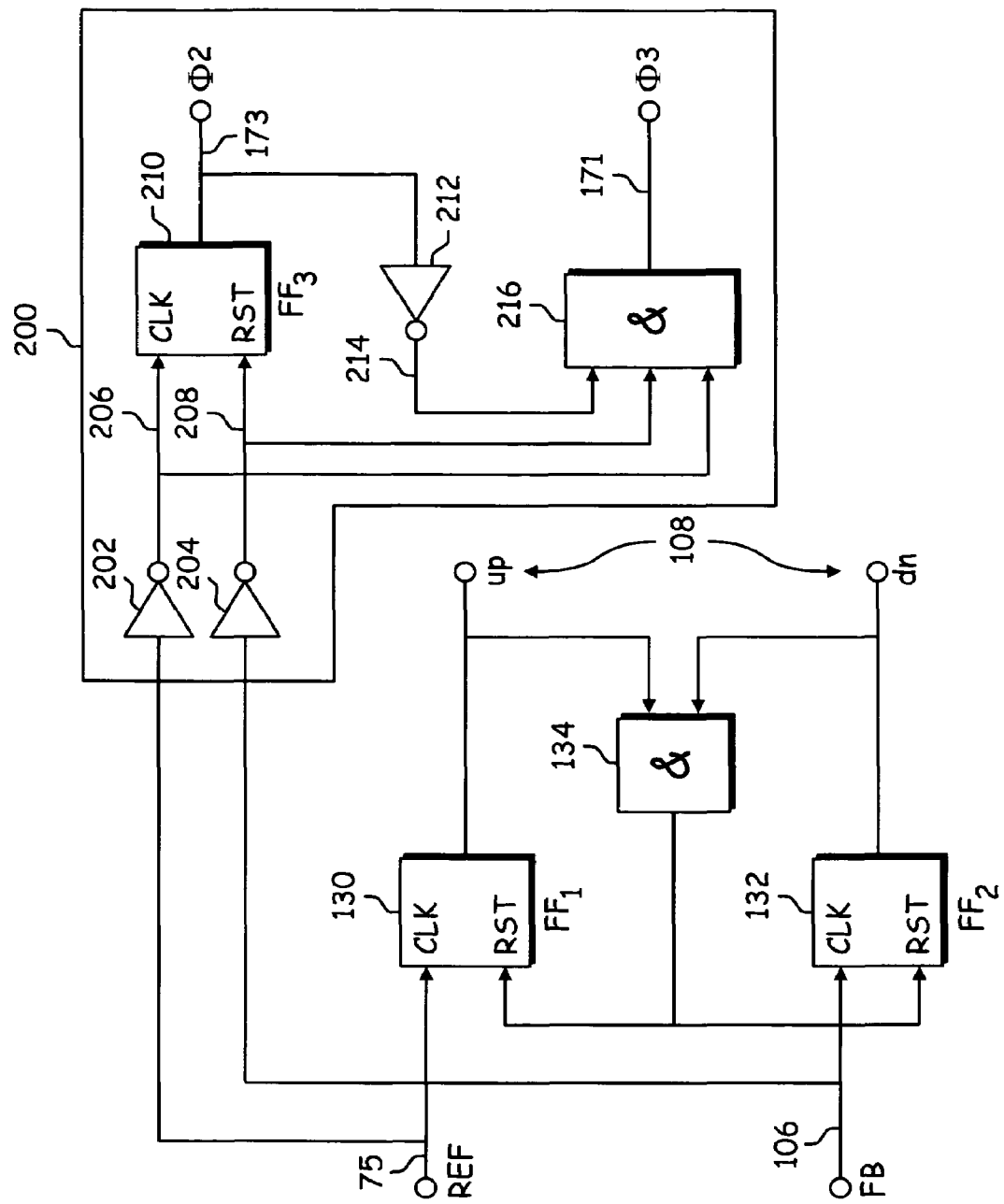
FIG. 7 is a functional block diagram of a clock generator for controlling the operation of the loop filter according to one embodiment of the invention.

Reference feed-through in the loop filter structure shown in FIG. 6 is further minimized by employing uniform sampling of the phase error. FIG. 7 is a functional block diagram of a clock generator 200 for generating the first clock signal ($\Phi_3$) 171 and the second clock signal ($\Phi_2$) 173 to implement uniform phase error sampling according to one embodiment of the invention. The clock generator 200 controls the timing of clock signals 171 and 173 using the reference signal (REF) 75 and the feedback signal (FB) 106. The clock generator 200 includes inverters 202, 204 and 212, reset-able flip-flop 210 and AND logic gate 216.

Inverters 202 and 204 are coupled to the inputs of flip-flops 130 and 132 of the PFD to receive the reference signal (REF) 75 and the feedback signal (FB) 106, respectively. Inverters 202 and 204 operate to invert REF 75 and FB 106 and produce inverted REF and FB signals 206 and 208, respectively. The outputs of inverters 202 and 204 are coupled to the inputs of a reset-able flip-flop 210 and to the input of the AND gate 216. The output of flip-flop 210 is the second clock signal ($\Phi_3$) 173, which is coupled to inverter 212 to produce inverted clock signal 214. Inverted clock signal 215 is also input to AND gate 216. The output of AND gate 216 is the first clock signal ($\Phi_3$) 171.

The operation of the clock generator 200 is as follows. After reset of flip-flop 210, $\Phi_2$ is LOW, or 0. When REF goes LOW, or 0, while FB is high, or 1, $\Phi_2$ goes HIGH momentarily, enabling charge sharing between capacitors C1 and C2, as shown in FIG. 6. When FB goes LOW, while REF remains LOW, flip-flop 210 is reset, causing $\Phi_2$ to go LOW to disconnect capacitors C1 and C2, and $\Phi_3$ goes HIGH momentarily, discharging capacitor C1. When FB goes HIGH, while REF remains LOW, $\Phi_3$ goes LOW, enabling capacitor C1 to charge to a voltage corresponding to the current pulse produced as a result of the error signal 108.

Figure 8:
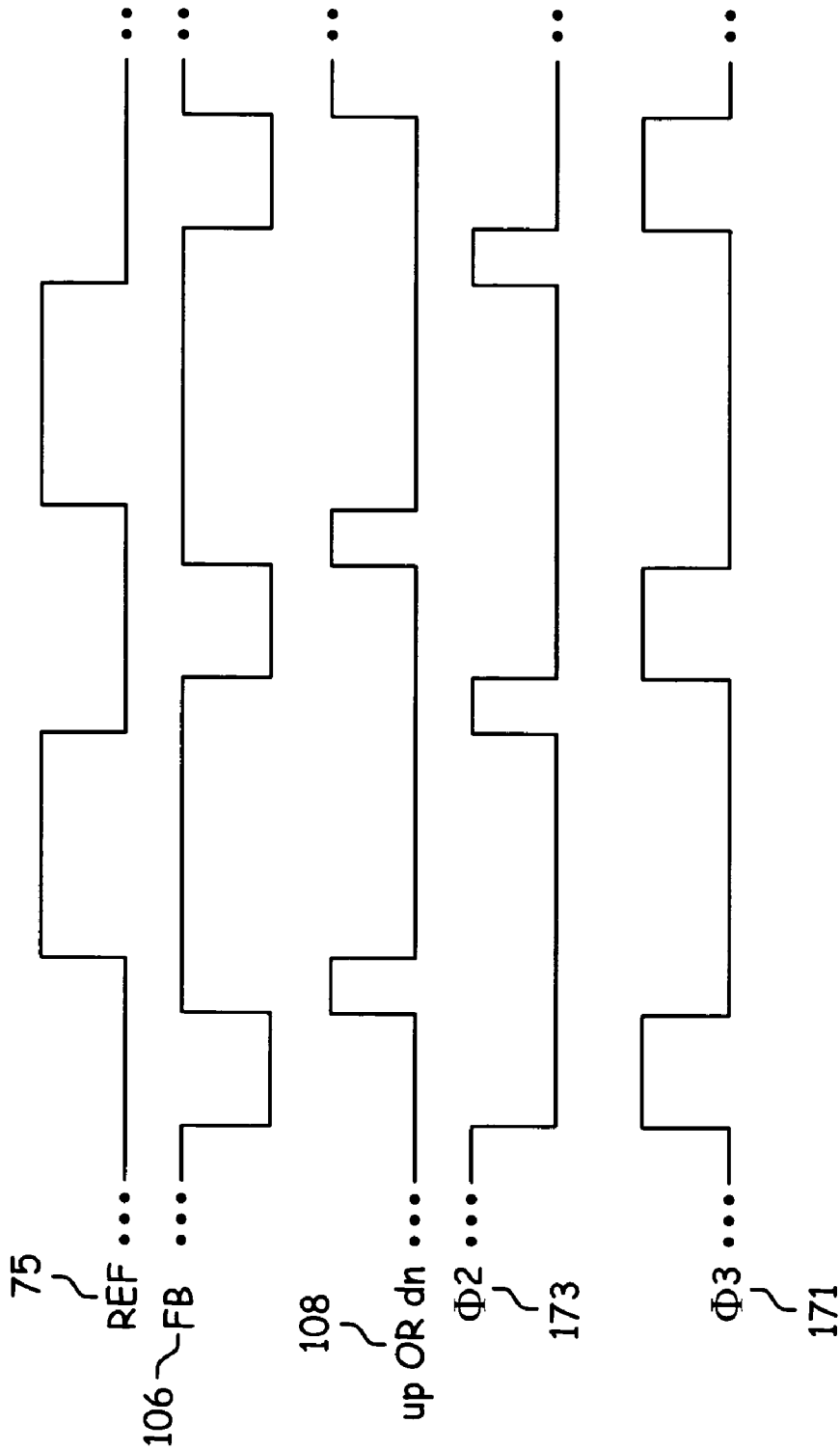
FIG. 8 is an exemplary timing diagram illustrating the operation of the loop filter according to one embodiment of the invention.

FIG. 8 is an exemplary timing diagram illustrating the operation of the loop filter according to one embodiment of the invention. In FIG. 8, exemplary states of the reference signal (REF) 75, the feedback signal (FB) 106, the error signal (up OR dn) 108, the first clock signal ($\Phi_3$) 171 and the second clock signal ($\Phi_2$) 173 are shown. As shown in FIG. 8, REF 75 is initially LOW and FB 106 is initially HIGH. When FB 106 goes LOW while REF 75 remains LOW, $\Phi_2$ goes LOW and $\Phi_3$ goes HIGH. Then, when FB 106 goes HIGH while REF 75 remains LOW, the error signal 108 goes HIGH and $\Phi_3$ goes LOW, causing the capacitor C1 (shown in FIG. 6) to begin to accumulate charge as a result of the error signal 108 going HIGH.

When REF 75 goes HIGH, while FB 106 remains HIGH, the error signal goes LOW, limiting the charge accumulated by capacitor C1 to the current pulse produced as a result of the difference in phase or frequency between REF 75 and FB 106. When REF 75 goes LOW again, while FB 106 remains HIGH, Φ₂ goes LOW, enabling charge sharing between capacitors C1 and C2, as shown in FIG. 6. Thereafter, when FB 106 goes LOW, while REF remains LOW, Φ₂ goes LOW, disconnecting capacitors C1 and C2, and Φ₃ goes HIGH, discharging capacitor C1. Then, when FB goes HIGH again, while REF remains LOW, the error signal 108 goes HIGH and Φ₃ goes LOW, enabling capacitor C1 to charge to a voltage corresponding to the current pulse produced as a result of the error signal 108.

Figure 9:
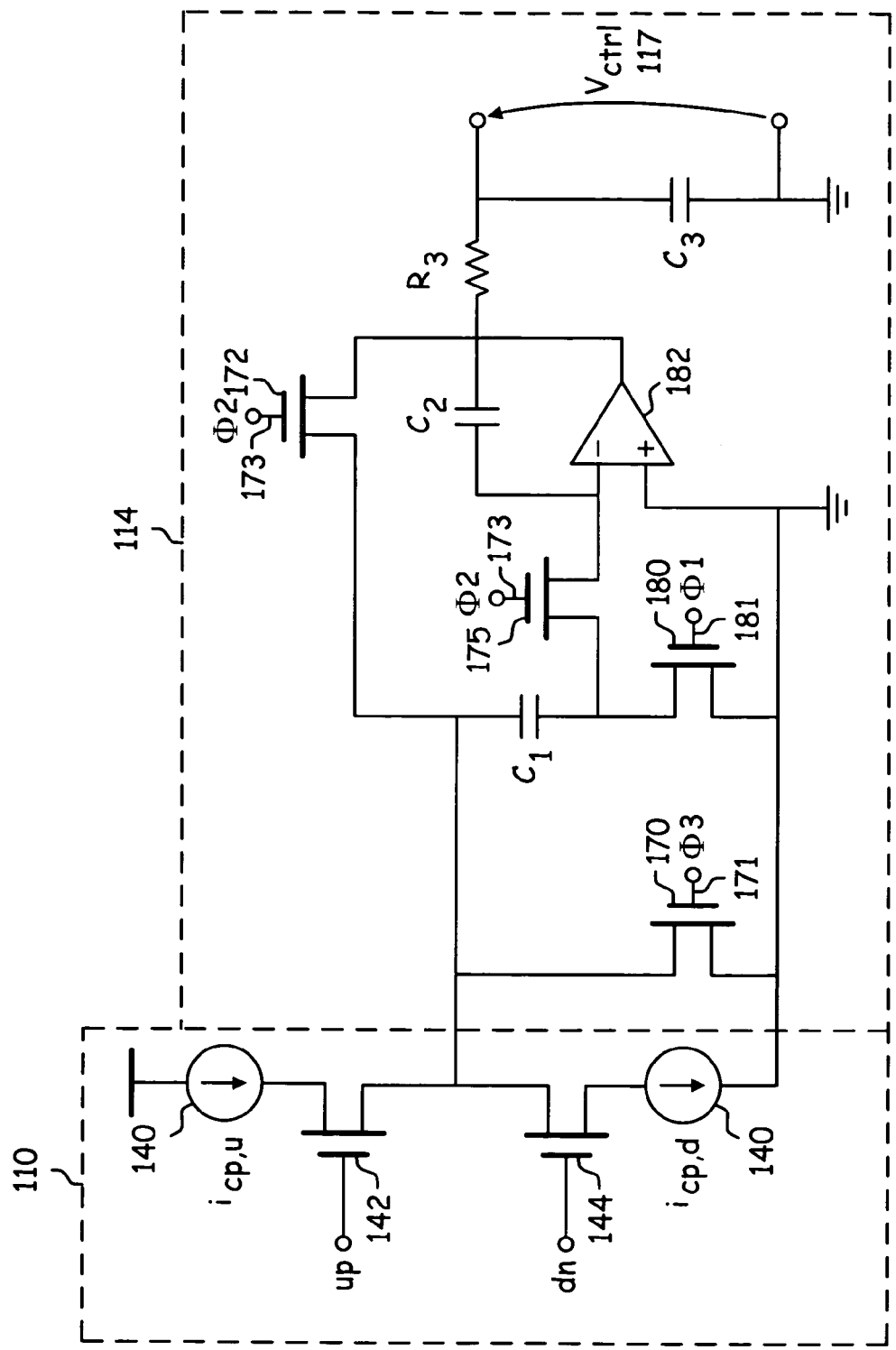
FIG. 9 is a functional block diagram a loop filter according to another embodiment of the invention.

FIG. 9 is a functional block diagram of a charge pump 110 and loop filter 114 configuration according to another embodiment of the invention. The charge pump 110 in FIG. 9 is similar to the charge pump of FIGS. 4 and 6 in that charge pump 110 is coupled to receive the error signal produced by the PFD and produce current pulses based upon the error signal. In addition, the loop filter 114 of FIG. 9 is similar to the loop filter 114 of FIG. 6 in that the loop filter 114 of FIG. 9 uses a metal switched-capacitor configuration formed of switches 170 and 172 and metal capacitors C1 and C2. However, FIG. 9 further includes switches 175 and 180 and op-amp 182, which operate to control the charging of capacitor C1.

The mode of operation of the combination of the charge pump 110 and loop filter 114 shown in FIG. 9 is as follows. As described above, charge pump 110 produces a current pulse based upon the error signal. While charge pump 110 is producing the current pulse, a third clock signal (Φ₁) 181 places switch 180 in an "ON" or closed state, the first clock signal (Φ₃) 171 places switch 170 in an "OFF" or open state and the second clock signal (Φ₂) 173 places switch 172 in an "OFF" or open state to enable the capacitor C1 to charge to a voltage corresponding to the current pulse. After capacitor C1 has completely charged, the third clock signal 181 places switch 180 in an "OFF" or open state to discontinue charging of capacitor C1, and the second clock signal 173 places switch 172 in an "ON" or closed state to connect capacitors C1 and C2 and enable charge sharing between capacitors C1 and C2. Once charge sharing is complete, the second clock signal 173 places switch 172 in an open state to disconnect capacitors C1 and C2, and the first clock signal 171 places switch 170 in a closed state to discharge capacitor C1.

Figure 10:
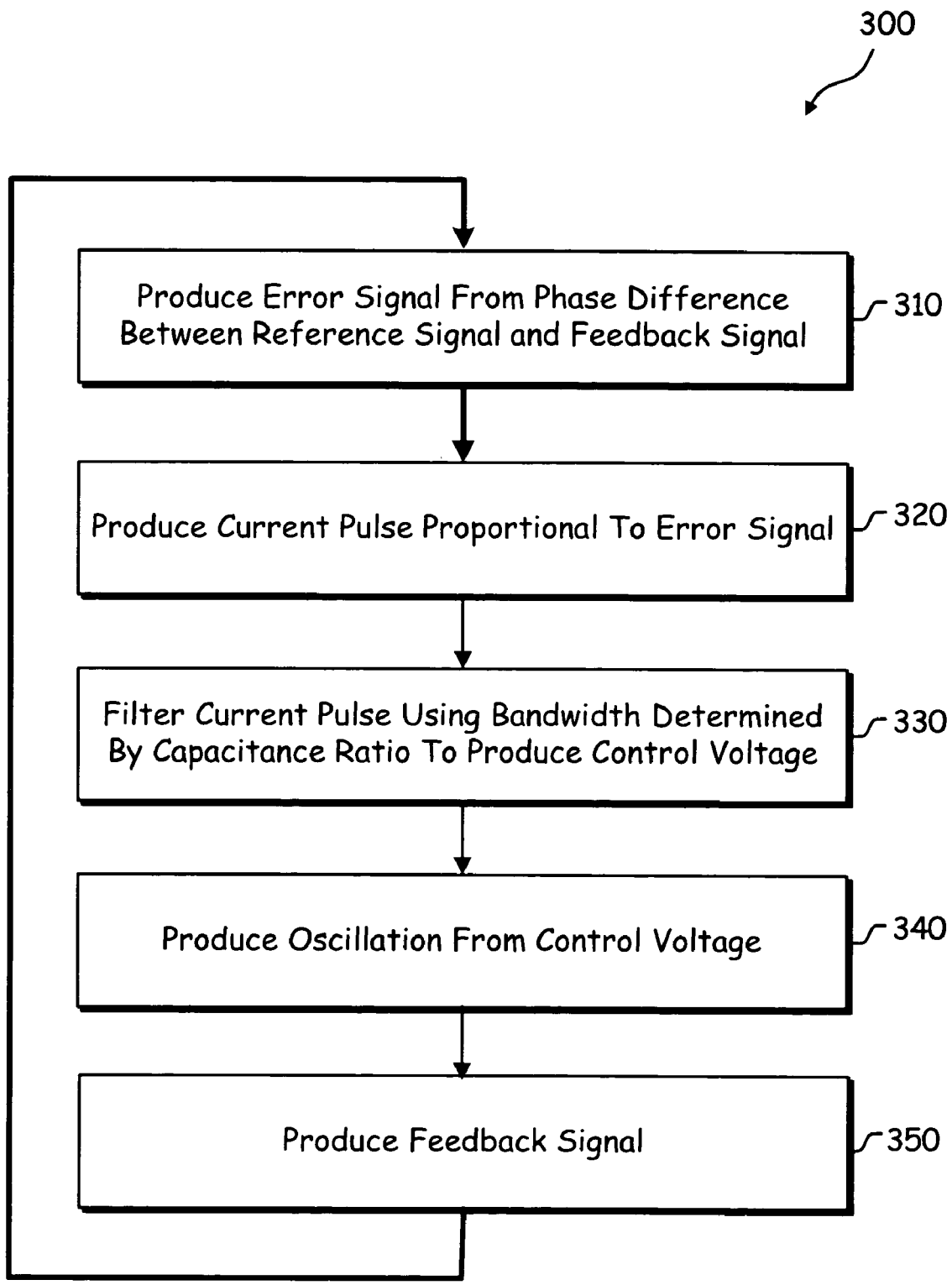
FIG. 10 is a flowchart illustrating a method for producing an oscillation according to one embodiment of the invention.

FIG. 10 is a flowchart illustrating a method 300 for producing an oscillation according to one embodiment of the invention. Initially, the method includes producing an error signal (step 310) from a phase or frequency difference between a reference signal and a feedback signal. From the error signal, a current pulse proportional to the error signal is produced (step 320). Thereafter, the method includes filtering the current pulse using a bandwidth determined by a ratio of two capacitance values to produce a control voltage (step 330). The method further includes producing the output oscillation from the control voltage (step 340). Finally, the method includes producing a feedback signal by dividing the oscillation by a programmable divider (step 350), which is used in producing the next error signal (step 310).

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled".

In addition, as one of ordinary skill in the art will appreciate, other embodiments may be derived from the teachings of the present invention without deviating from the scope of the claims.

The invention claimed is:

1. A loop filter for use in a frequency synthesizer, comprising:
   a first switched capacitor including a first metal capacitor having a first capacitance value and operable to charge to a first voltage corresponding to a current pulse indicative of a difference in phase or frequency between a reference signal and a feedback signal, and first switched capacitor further including a first switch coupled to said first metal capacitor and operable in a first state to enable said first metal capacitor to charge to said first voltage and in a second state to discharge said first metal capacitor; and
   a second switched capacitor having a second capacitance value and operable to charge to a second voltage from said first voltage and produce a control voltage based upon said second voltage;
   wherein said loop filter has a bandwidth determined by a ratio of said second capacitance value to said first capacitance value.

2. The loop filter of claim 1, wherein said second switched capacitor further includes:
   a second metal capacitor having said second capacitance value and connected in parallel to said first metal capacitor, said second metal capacitor being operable to charge to said second voltage; and
   a second switch coupled to said second metal capacitor and operable in a first state to prevent charge sharing between said first metal capacitor and said second metal capacitor and in a second state to enable charge sharing between said first metal capacitor and said second metal capacitor to charge said second metal capacitor to said second voltage.

3. The loop filter of claim 2, further comprising:
   at least one additional switch coupled to said first metal capacitor and operable in a first state to charge said first metal capacitor to said first voltage and in a second state to cease charging of said first metal capacitor.

4. The loop filter of claim 2, wherein:
   said second voltage varies over time as a function of said first voltage until said second voltage reaches a steady state voltage; and
   charge sharing between said first metal capacitor and said second metal capacitor ceases when said first voltage and said second voltage are equivalent to said steady state voltage.

5. The loop filter of claim 1, further comprising:
   a passive filter operable to lowpass filter said second voltage to produce said control voltage.

6. A frequency synthesizer, comprising:
   a phase frequency detector operable to produce an error signal indicative of a difference in phase or frequency between a reference signal and a feedback signal;

a charge pump operable to generate a current pulse proportional to said error signal;

a loop filter operable to filter said current pulse to produce a control voltage, wherein said loop filter includes:

a first switched capacitor including a first metal capacitor having a first capacitance value and operable to charge to a first voltage corresponding to said current pulse, said first switched capacitor further including a first switch coupled to said first metal capacitor and operable in a first state to enable said first metal capacitor to charge to said first voltage and in a second state to discharge said first metal capacitor, and a second switched capacitor having a second capacitance value and operable to charge to a second voltage from said first voltage and produce said control voltage based upon said second voltage;

wherein said loop filter has a bandwidth determined by a ratio of said second capacitance value to said first capacitance value; and an oscillator operable to produce an oscillation and said feedback signal based upon said control voltage.

7. The frequency synthesizer of claim 6, wherein said second switched capacitor further includes:

a second metal capacitor having said second capacitance value and connected in parallel to said first metal capacitor, said second metal capacitor being operable to charge to said second voltage; and a second switch coupled to said second metal capacitor and operable in a first state to prevent charge sharing between said first metal capacitor and said second metal capacitor and in a second state to enable charge sharing between said first metal capacitor and said second metal capacitor to charge said second metal capacitor to said second voltage.

8. The frequency synthesizer of claim 7, wherein said loop filter further includes:

at least one additional switch coupled to said first metal capacitor and operable in a first state to charge said first metal capacitor to said first voltage and in a second state to cease charging of said first metal capacitor.

9. The frequency synthesizer of claim 7, wherein:

said second voltage varies over time as a function of said first voltage until said second voltage reaches a steady state voltage; and charge sharing between said first metal capacitor and said second metal capacitor ceases when said first voltage and said second voltage are equivalent to said steady state voltage.

10. The frequency synthesizer of claim 9, further comprising:

a frequency divider operably coupled to receive said feedback signal and divide said feedback signal by an integer divide ratio, and wherein said feedback signal generated by said oscillator has a frequency equal to the product of the frequency of said reference signal and the divide ratio.

11. The frequency synthesizer of claim 6, wherein said loop filter further includes:

a passive filter operable to lowpass filter said second voltage to produce said control voltage.

12. The frequency synthesizer of claim 6, further comprising:

a clock generator operably coupled to receive said reference signal and said feedback signal and operable to generate a first clock signal for clocking said first switched capacitor and a second clock signal for clocking said second switched capacitor.

13. The frequency synthesizer of claim 12, wherein said clock generator further includes:

a flip-flop operable to generate said second clock signal from said reference signal and said feedback signal; and a logic gate operable to generate said first clock signal from said reference signal and said feedback signal and said second clock signal.

14. The frequency synthesizer of claim 13, wherein said clock generator further includes:

a first inverter connected to receive said reference signal and operable to produce an inverted reference signal and provide said inverted reference signal to said flip-flop and said logic gate;

a second inverter connected to receive said feedback signal and operable to produce an inverted feedback signal and provide said inverted feedback signal to said flip-flop and said logic gate; and a third inverter connected to receive said first clock signal and operable to produce an inverted first clock signal and provide said inverted first clock signal to said logic gate.

15. A method within a frequency synthesizer, comprising:

producing an error signal indicative of a difference in phase or frequency between a reference signal and a feedback signal;

producing a current pulse proportional to said error signal;

filtering said current pulse using a bandwidth determined by a ratio of a first capacitance value to a second capacitance value to produce a control voltage, said filtering including:

charging a first switched capacitor having said second capacitance value to a first voltage corresponding to said current pulse, charging a second switched capacitor having said first capacitance value to a second voltage from said first voltage by enabling charge sharing between said first switched capacitor and said second switched capacitor to vary said second voltage over time as a function of said first voltage until said second voltage reaches a steady state voltage and ceasing charge sharing between said first switched capacitor and said second switched capacitor when said first voltage and said second voltage are equivalent to said steady state voltage, and producing said control voltage based upon said second voltage; and producing an oscillation based upon the control voltage.

16. The method of claim 15, further comprising:

generating a first clock signal for clocking said first switched capacitor from said reference signal, said feedback signal and a second clock signal; and generating said second clock signal for clocking said second switched capacitor from said reference signal and said feedback signal.

* * * * *

UNITED STATES PATENT AND TRADEMARK OFFICE
CERTIFICATE OF CORRECTION

| | |
|---|---|
| PATENT NO. | : 7,405,630 B2 |
| APPLICATION NO. | : 11/242432 |
| DATED | : July 29, 2008 |
| INVENTOR(S) | : Henrik T. Jensen |

It is certified that error appears in the above-identified patent and that said Letters Patent is hereby corrected as shown below:

Column 8, line 21, in Claim 1: replace "signal, and first" with --signal, said first--.

Signed and Sealed this

Third Day of March, 2009

JOHN DOLL
*Acting Director of the United States Patent and Trademark Office*